(12) United States Patent
Choi

(10) Patent No.: US 6,912,169 B2
(45) Date of Patent: Jun. 28, 2005

(54) SYNCHRONOUS SEMICONDUCTOR MEMORY DEVICE

(75) Inventor: Hong-Sok Choi, Ichon-shi (KR)

(73) Assignee: Hynix Semiconductor Inc., Kyounki-do (KR)

(*) Notice: Subject to any disclaimer, the term of this patent is extended or adjusted under 35 U.S.C. 154(b) by 0 days.

(21) Appl. No.: 10/750,506

(22) Filed: Dec. 31, 2003

(65) Prior Publication Data

US 2004/0233756 A1 Nov. 25, 2004

(30) Foreign Application Priority Data

May 23, 2003 (KR) .......................................... 2003-32808

(51) Int. Cl.$^7$ ................................................. G11C 7/00
(52) U.S. Cl. ........................ 365/222; 365/201; 365/233
(58) Field of Search ................................ 365/222, 201, 365/233, 236

(56) References Cited

U.S. PATENT DOCUMENTS

| | | | |
|---|---|---|---|
| 5,313,428 A | 5/1994 | Inoue | |
| 5,450,364 A | * 9/1995 | Stephens et al. | ............. 365/222 |
| 5,453,959 A | 9/1995 | Sakuta et al. | |
| 5,566,117 A | 10/1996 | Okamura et al. | |
| 5,703,823 A | 12/1997 | Douse et al. | |
| 5,940,851 A | 8/1999 | Leung | |
| 6,084,813 A | 7/2000 | Kikuchi et al. | |
| 6,118,719 A | 9/2000 | Dell et al. | |
| 6,249,473 B1 | 6/2001 | Lau et al. | |
| 6,327,208 B1 | 12/2001 | Kitade | |
| 6,741,515 B2 | * 5/2004 | Lazar et al. | ................. 365/222 |
| 2002/0097625 A1 | 7/2002 | Hashimoto | |
| 2002/0120811 A1 | 8/2002 | Maeda | |
| 2003/0128613 A1 | * 7/2003 | Ariki | .......................... 365/222 |

FOREIGN PATENT DOCUMENTS

| | | |
|---|---|---|
| JP | 07-169266 | 7/1995 |
| JP | 07-182855 | 7/1995 |
| JP | 07-182857 | 7/1995 |
| JP | 2000-030438 | 1/2000 |
| JP | 2002-358799 | 12/2002 |

* cited by examiner

*Primary Examiner*—Gene N. Auduong
(74) *Attorney, Agent, or Firm*—Blakely Sokoloff Taylor & Zafman

(57) ABSTRACT

A self refresh operation control device, for use in a semiconductor memory device, includes a self refresh pulse signal generation block for generating a self refresh pulse signal, a self refresh entry signal and a self refresh mode clock enable signal in response to a clock enable signal, a self refresh signal, a self refresh end signal and a test mode signal, wherein the self refresh pulse signal is generated during the inactivated period of the clock enable signal by using the test mode signal; a normal mode clock signal generation block for generating a normal mode clock signal and a counter reset signal in response to the clock enable signal, the self refresh mode clock enable signal, a test mode signal and the self refresh signal; and an internal row address counter in response to the self refresh pulse signal and the counter reset signal for generating internal addresses for use in the self refresh operation.

9 Claims, 4 Drawing Sheets

SYNCHRONOUS SEMICONDUCTOR MEMORY DEVICE

FIELD OF INVENTION

The present invention relates to a semiconductor memory device; and, more particularly, to a synchronous semiconductor memory device having a self refresh operation.

DESCRIPTION OF PRIOR ART

Generally, a semiconductor memory device has two different types: one is a dynamic random access memory (DRAM) and the other is a static random access memory (SRAM).

Since a memory cell included in the SRAM is formed by four latched transistors, the SRAM can hold its data without external refresh, for as long as power is supplied to the SRAM.

In contrast, a memory cell included in the DRAM is formed by a transistor and a capacitor, and the capacitor has to be charged or discharged for the DRAM operation. Data is stored in the form of electrical charge in the capacitor. However, charge quantity stored in the capacitor is reduced as time passes. Therefore, the DRAM must be refreshed periodically in order to hold its data contents. A retention time is a maximum time the memory cell can hold its data without refresh.

There are two different refresh operations depending on kinds of the DRAM: one is an auto refresh operation; and the other is a self refresh operation. The self refresh operation is performed during the DRAM is not in a normal mode, i.e., the DRAM does not perform a data access operation. On the contrary, the auto refresh operation is performed during the DRAM is in the normal mode.

In addition, a synchronous semiconductor memory device is operated synchronizing with an external clock signal. For example, a synchronous dynamic random access memory (SDRAM) performs the data access operation at every rising edge of the external clock signal.

FIG. 1 is a block diagram showing a conventional synchronous semiconductor memory device performing the self refresh operation.

As shown, the conventional semiconductor memory device includes a self refresh mode clock enable buffer 10, a self refresh mode entry circuit 12, a self refresh mode exit circuit 13, a self refresh signal generator 15, a self refresh pulse generator 16, an internal row address counter 17, a normal mode clock enable buffer 11 and a clock buffer 14.

The self refresh mode clock enable buffer 10 is controlled by a clock enable signal CKE and a self refresh signal SELF to generate a self refresh mode clock enable signal SCKE0. The self refresh mode entry circuit 12 is controlled by the clock enable signal CKE and a command signal CMD to generate a self refresh entry signal SELF_EN.

The self refresh mode exit circuit 13 generates a self refresh exit signal SELF_EXIT in response to the self refresh mode clock enable signal SCKE0, a self refresh pulse signal SELFPULSE and a self refresh end signal REFEND.

The self refresh signal generator 15 generates a self refresh signal SELF in response to the self refresh entry signal SELF_EN and the self refresh exit signal SELF_EXIT.

The self refresh pulse generator 16 generates a self refresh pulse signal SELFPULSE in response to the self refresh signal SELF. The internal row address counter 17 generates an internal row address X-ADD by counting pulses of the self refresh pulse signal SELFPULSE.

Herein, the self refresh mode exit circuit 13 is provided with a first NOR gate NOR1, a second NOR gate NOR2 and a first NAND gate NAND1.

The first NOR gate NOR1 and the second NOR gate NOR2 are cross coupled to form an RS-LATCH, i.e., an outputted signal NODE A from the first NOR gate NOR1 is inputted to the second NOR gate NOR2 and an outputted signal from the second NOR gate NOR2 is inputted to the first NOR gate NOR1. The first NOR gate NOR1 receives the self refresh pulse signal SELFPULSE, and the second NOR gate NOR2 receives a refresh end pulse signal REFEND and an initial signal RST. The RS-LATCH, i.e., the cross coupled NOR gates, is set by the self refresh pulse signal SELFPULSE and reset by the self refresh end pulse signal REFEND. The initial signal RST is inputted to the second NOR gate to initialize the RS-LATCH.

The first NAND gate NAND1 receives the self refresh mode clock enable signal SCKE0 and the outputted signal NODE A from the first NOR gate NOR1, and performs logic NAND operation on the two received signals.

There are the normal mode clock enable buffer 11 and the clock buffer 14 for the normal mode operation of the conventional synchronous semiconductor memory device.

The normal mode clock enable buffer 11 receives the clock enable signal CKE and an inverted self refresh signal to generate a normal mode clock enable signal SCKE1.

The clock buffer 14 is controlled by the normal mode clock enable signal SCKE1 and generates an internal clock signal CLKI by buffering an external clock signal CLK.

FIG. 2 is a timing diagram showing the self refresh operation of the conventional synchronous semiconductor memory device shown in FIG. 1.

Referring to FIGS. 1 and 2, the self refresh operation is described below.

If the self refresh entry signal SELF_EN is activated by the clock enable signal CKE and the command signal CMD, the self refresh signal generator 15 activates the self refresh signal SELF, i.e., the self refresh signal SELF becomes a logic 'HIGH' level.

While the self refresh signal SELF is in a logic 'HIGH' level, the self refresh pulse generator 16 generates a periodic pulse signal, i.e., the self refresh pulse signal SELFPULSE.

At every pulse of the self refresh pulse signal SELFPULSE, the internal row address counter 17 increases the internal row address X-ADD sequentially, whereby every memory cell corresponding to the internal row address X-ADD is refreshed.

Herein, during the self refresh operation, all the circuit units except needed circuit units for the self refresh operation are disabled, whereby the conventional synchronous semiconductor memory device can consume minimum power. The self refresh mode clock enable buffer 10 still operates during the self refresh operation to detect a clock transition, i.e., from a logic 'LOW' level to a logic 'HIGH' level of the clock enable signal CKE.

However, according to the conventional semiconductor memory device, since all the circuit units except needed circuit units for the self refresh operation are disabled, there is a problem that it is not possible to test operations of the conventional semiconductor memory device, e.g., for example, to test a cycle of the self refresh operation during the self refresh operation.

SUMMARY OF INVENTION

It is, therefore, an object of the present invention is to provide a synchronous semiconductor memory device having a capability of testing the synchronous semiconductor memory device during a self refresh operation.

In accordance with an aspect of the present invention, there is provided a self refresh operation control device including a self refresh pulse signal generation block for generating a self refresh pulse signal, a self refresh entry signal and a self refresh mode clock enable signal in response to a clock enable signal, a self refresh signal, a self refresh end signal and a test mode signal, wherein the self refresh pulse signal is generated during the inactivated period of the clock enable signal by using the test mode signal; a normal mode clock enable signal generation block for generating a normal mode clock signal and a counter reset signal in response to the clock enable signal, the self refresh mode clock enable signal, a test mode signal and the self refresh signal; and an internal row address counter in response to the self refresh pulse signal and the counter reset signal for generating internal addresses for use in the self refresh operation.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a control circuit for controlling a row active time, for use in a semiconductor memory device, in accordance with the present invention will be described in detail referring to the accompanying drawings.

Figure 1:
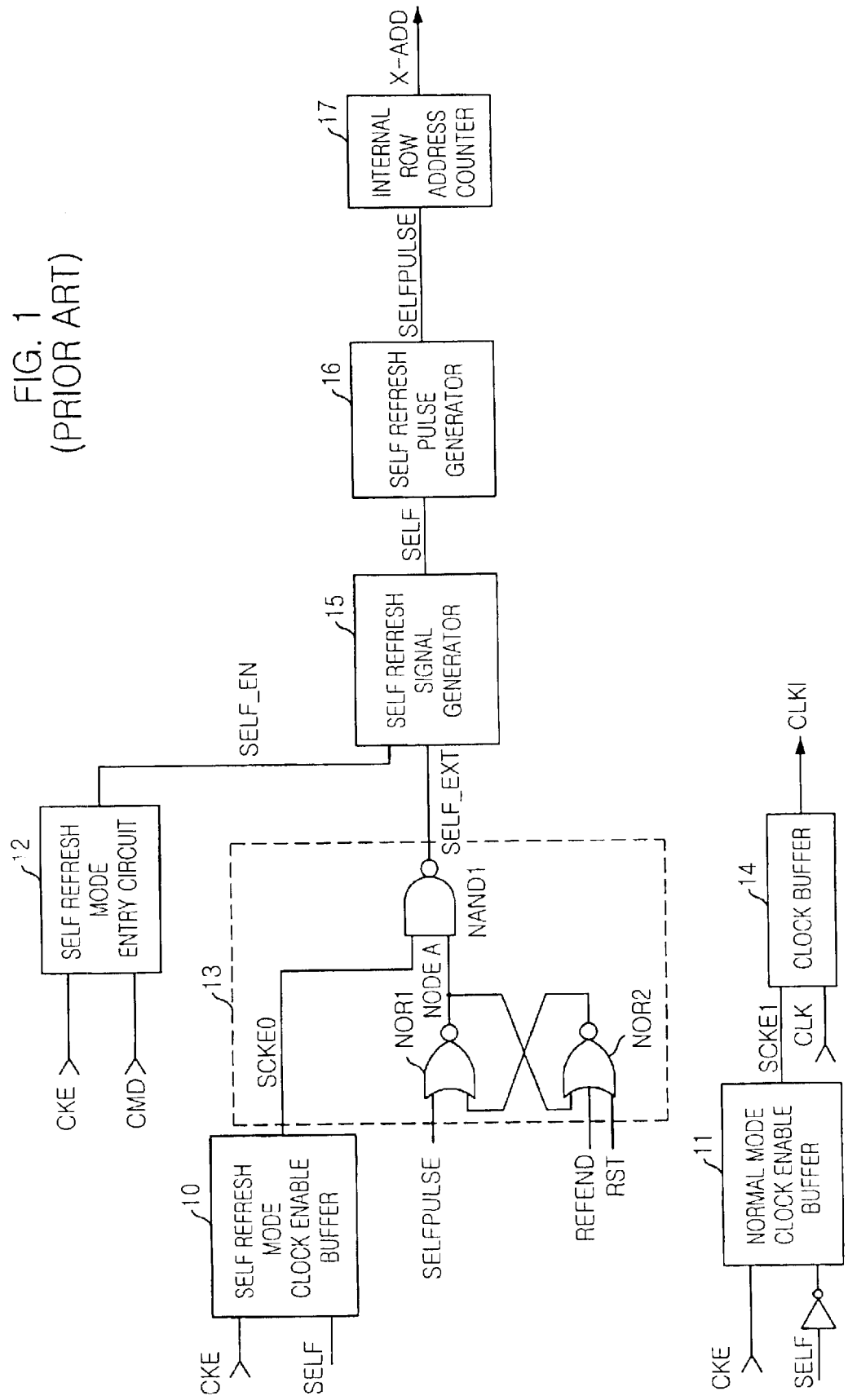
FIG. 1 is a block diagram showing a conventional synchronous semiconductor memory device having a self refresh operation.
Figure 2:
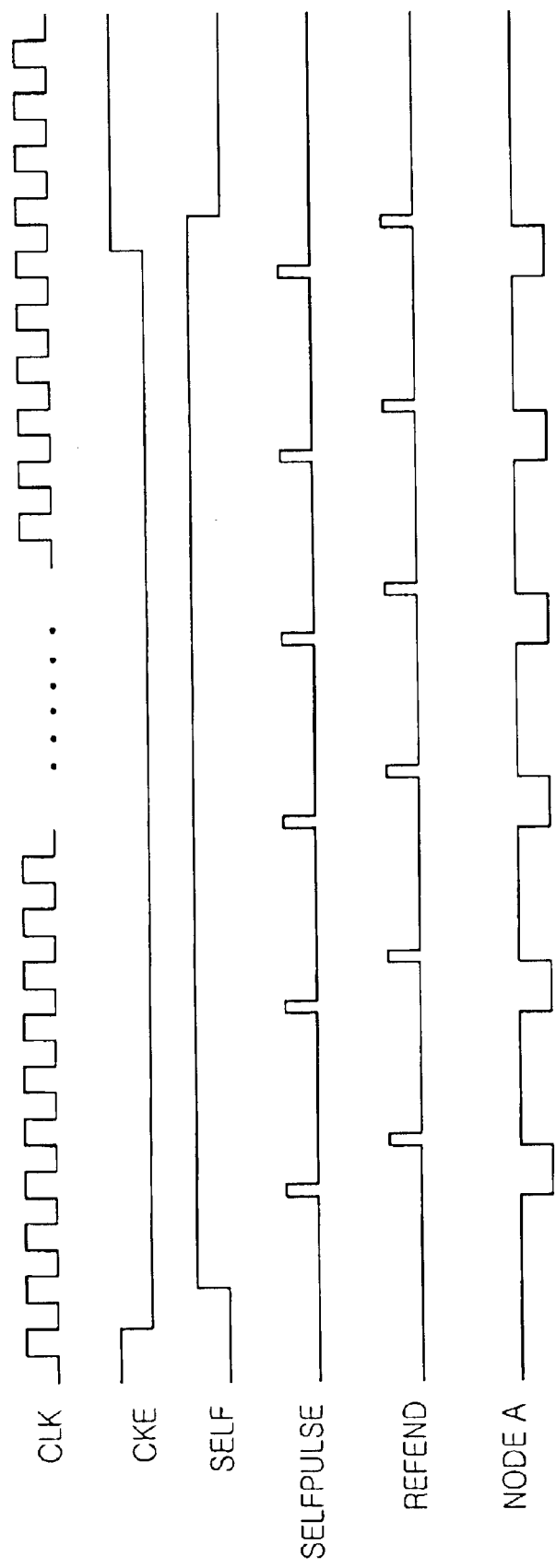
FIG. 2 is a timing diagram showing the self refresh operation of the conventional semiconductor memory device shown in FIG. 1.
Figure 3:
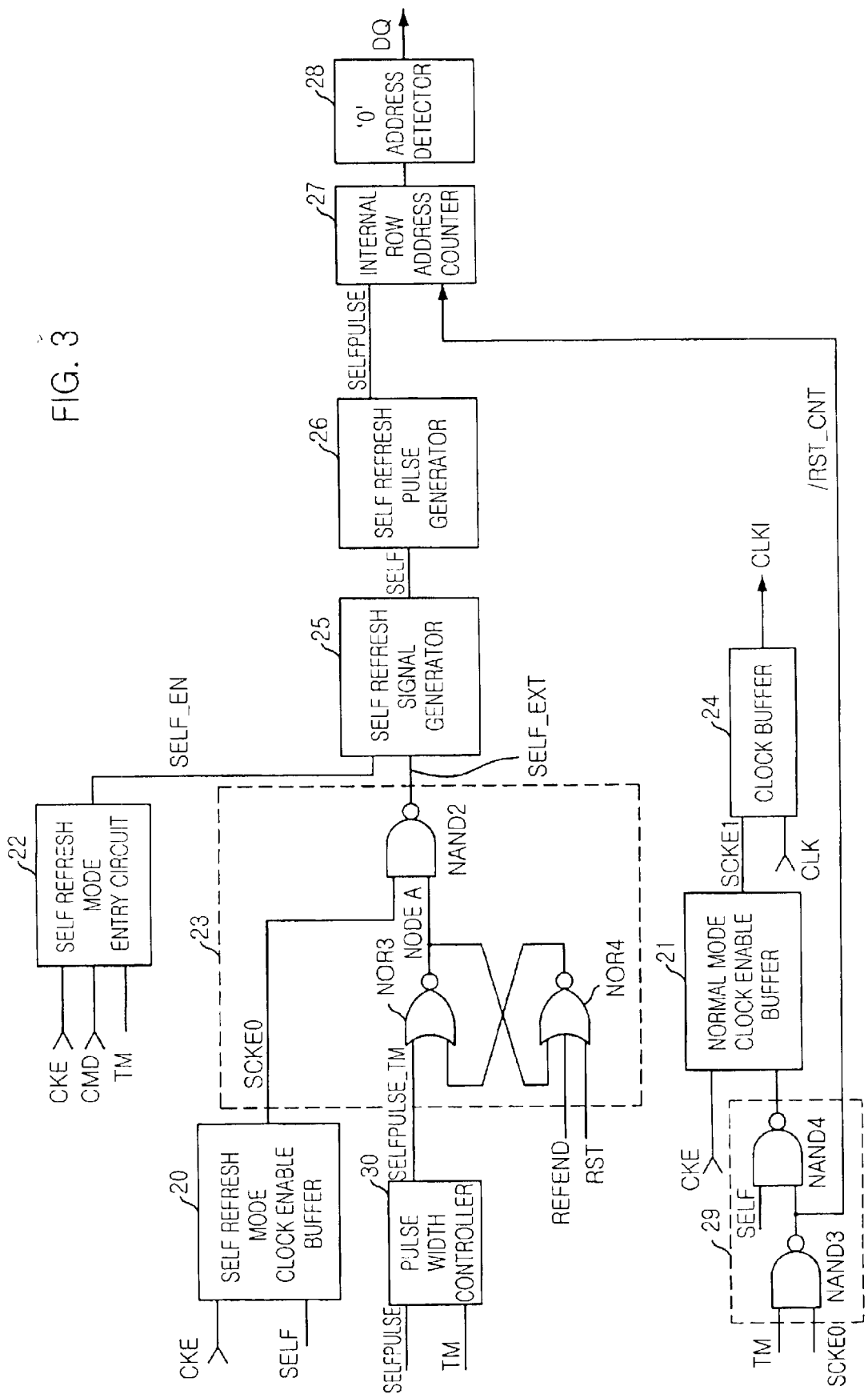
FIG. 3 is a block diagram showing an embodiment for the synchronous semiconductor memory device in accordance with the present invention.

FIG. 3 is a block diagram showing an embodiment of the synchronous semiconductor memory device in accordance with the present invention.

As shown, the synchronous semiconductor memory device includes a self refresh mode clock enable buffer 20, a self refresh mode entry circuit 22, a pulse width controller 30, a self refresh mode exit circuit 23, a self refresh signal generator 25, a self refresh pulse generator 26, a test mode controller 29, a normal mode clock enable buffer 21, a clock buffer 24, an internal row address counter 27 and a '0' address detector 28.

The self refresh mode clock enable buffer 20 is controlled by a clock enable signal CKE and a self refresh signal SELF to generate a self refresh mode clock enable signal SCKE0. The self refresh mode entry circuit 22 is controlled by the clock enable signal CKE and a command signal CMD to generate a self refresh entry signal SELF_EN.

The test mode controller 29 activates the normal mode clock enable buffer 21 and generates a counter reset signal /RST_CNT in response to a test mode signal TM, the self refresh mode clock enable signal SCKE0 and the self refresh signal SELF.

Herein, the synchronous semiconductor memory device performs a normal operation for data access and a self refresh operation. Even though the synchronous semiconductor memory device is in a test mode, the synchronous semiconductor performs the self refresh operation and the normal operation.

Hereinafter, the self refresh operation and the normal operation in the test mode are referred as a test self refresh operation and a test normal operation respectively.

The pulse width controller 30 is for enlarging a width of a self refresh pulse signal SELFPULSE during the test self refresh operation. The self refresh mode exit circuit 23 generates a self refresh exit signal SELF_EXIT for indicating self refresh exit timing to the self refresh signal generator 25 in response to the self refresh mode clock enable signal SCKE0, a self refresh end signal REFEND and an outputted signal SELFPULSE_TM from the pulse width controller 30.

The self refresh signal generator 25 is for generating the self refresh signal SELF in response to the outputted signals from the self refresh mode entry circuit 22 and the self refresh mode exit circuit 23. The self refresh pulse generator 26 receives the self refresh signal SELF to generate the self refresh pulse signal SELFPULSE.

The normal mode clock enable buffer 21 generates a normal mode clock enable signal SCKE1 in response to the clock enable signal CKE and an outputted signal from the test mode controller 29. The clock buffer 24 controlled by the normal mode clock enable signal SCKE1 outputs an internal clock signal CLKI by buffering an external clock signal CLK.

The internal row address counter 27 is initialized by the counter rest signal /RST_CNT and generates an internal row address by counting pulses of the self refresh pulse signal SELFPULSE.

The '0' address detector 28 is for detecting the internal row address whose address is '0', i.e., each bit of the internal row address is '0'; then, the '0' address detector 28 outputs a flag signal through a data output pin DQ.

Herein, the self refresh mode exit circuit 23 is provided with a third NOR gate NOR3, a fourth NOR gate NOR4 and a second NAND gate NAND2.

The third NOR gate NOR3 and the fourth NOR gate NOR4 are cross coupled to form an RS-LATCH, i.e., an outputted signal NODE A from the third NOR gate NOR3 is inputted to the fourth NOR gate NOR4 and an outputted signal from the fourth NOR gate NOR4 is inputted to the third NOR gate NOR3. The third NOR gate NOR3 receives the SELFPULSE_TM from the pulse width controller 30, and the fourth NOR gate NOR4 receives the self refresh end pulse signal REFEND and a latch initializing signal RST.

The RS-LATCH, i.e., the cross coupled NOR gates, is set by the SELFPULSE_TM outputted from the pulse width controller 30 and is reset by the self refresh end pulse signal REFEND. The latch initializing signal RST serves to initialize the RS-LATCH.

The test mode controller 29 is provided with a third NAND gate NAND3 and a fourth NAND gate NAND4. The third NAND gate NAND3 receives the test mode signal TM and the self refresh mode clock enable signal SCKE0 is to output the counter reset signal /RST_CNT. The fourth NAND gate NAND4 receives the self refresh signal SELF and the counter reset signal /RST_CNT to output a signal for enabling the normal mode clock enable buffer 21.

Figure 4:
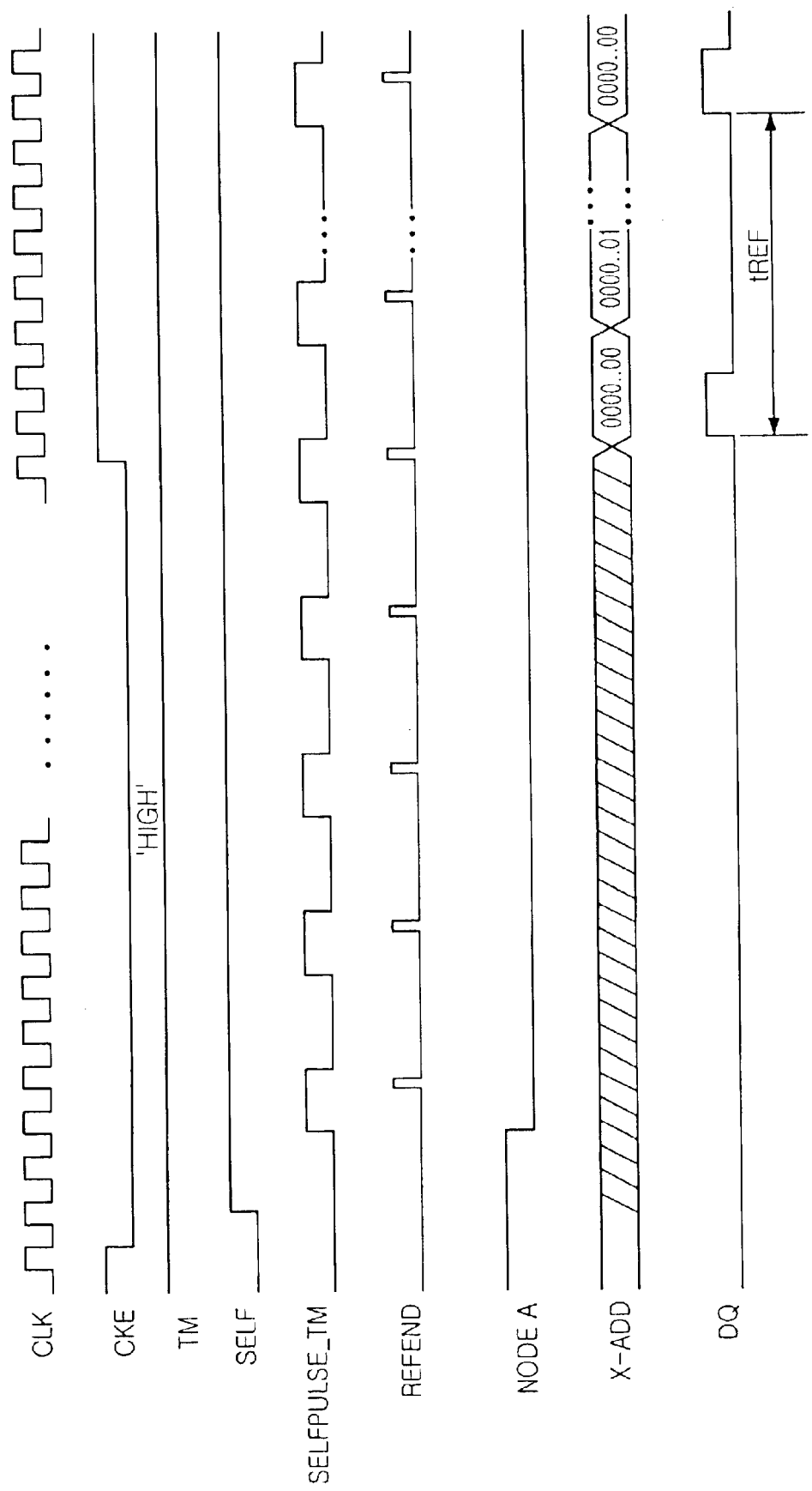
FIG. 4 is a timing diagram showing the self refresh operation while the synchronous semiconductor memory device is in a test mode.

FIG. 4 is a timing diagram showing the test self refresh operation.

The operation of the synchronous semiconductor memory device in accordance with the present invention is described below, referring to FIGS. 3 and 4.

First, the self refresh operation of the synchronous semiconductor memory device is described below.

In this case, the test mode signal TM is inactivated as a logic 'LOW' level and the self refresh mode entry circuit 22 indicates a start of the self refresh operation. The self refresh mode clock enable buffer 20 is enabled, whereby the self refresh signal SELF and the self refresh pulse signal SELFPULSE are activated. Then, the internal row address counter 27 outputs row addresses sequentially by counting the pulses of the self refresh pulse signal SELFPULSE, and memory cells according to the row addresses are refreshed. At this time, the pulse width controller 30 is disabled.

Meanwhile, since the test mode signal TM is inactivated, the outputted signal /RST_CNT from the third NAND gate NAND3 is inactivated as a logic 'HIGH' level regardless of the self refresh clock enable signal SCKE0. The output of the fourth NAND gate NAND4 is in a logic 'LOW' level, to thereby disable the normal mode clock enable buffer 21. Therefore, the clock buffer 24 is disabled and the internal clock signal CLKI is not generated from the clock buffer 24.

Second, the test self refresh operation is described below.

In this case, the test mode signal TM is activated as a logic 'HIGH' level. The outputted signal SELFPULSE_TM from the pulse width controller 30 is generated by enlarging the pulse width of the self refresh pulse signal SELFPULSE, thereby activating periods of the SELFPULSE_TM is overlapped with activating periods of the self refresh end signal REFEND.

Therefore, even if the self refresh end signal REFEND is activated and the clock enable signal CKE is changed from a logic 'LOW' level to a logic 'HIGH' level, the test self refresh mode is continued because an outputted signal NODE A from the third NOR gate NOR3 keeps a logic 'LOW' level.

If the clock enable signal CKE is changed from a logic 'LOW' level to a logic 'HIGH' level, since the test mode signal TM is in a logic 'HIGH' level and the self refresh mode clock enable signal SCKE0 is in a logic 'HIGH' level, the outputted signal from the third NAND gate NAND3, i.e., the counter reset signal /RST_CNT is activated as a logic 'LOW' level. Subsequently, the normal mode clock enable buffer 21 is enabled and the clock buffer 24 is also enabled, whereby the internal clock signal CLKI is generated.

In addition, when the clock enable signal CKE is changed from a logic 'LOW' level to a logic 'HIGH' level, the counter reset signal /RST_CNT is activated, whereby the internal row address counter 27 is initialized and internal row addresses are outputted sequentially from the internal row address counter 27.

Meanwhile, the '0' address detector 28 serves to detect the internal row address X-ADD whose address is '0', i.e., each bit of the internal row address X-ADD is '0'; then, the '0' address detector 28 outputs a flag signal through a data output pin DQ. After this, if the internal row address X-ADD is increased sequentially and becomes '0' address again, the '0' address detector 28 outputs the flag signal through the data output pin DQ. Herein, at this time, the flag signal is a logic 'HIGH' level.

Subsequently, the cycle of the flag signal indicates a needed time for one cycle of the self refresh operation, and this time is denoted as tREF in FIG. 4.

Therefore, it is possible to analyze and monitor the period of the self refresh operation to improve a performance of the semiconductor memory device.

While the present invention has been described with respect to the particular embodiments, it will be apparent to those skilled in the art that various changes and modifications may be made without departing from the spirit and scope of the invention as defined in the following claims.

What is claimed is:

1. An apparatus for controlling a self refresh operation in a synchronous semiconductor memory device, comprising:
    a self refresh pulse signal generation block for generating a self refresh pulse signal, a self refresh entry signal and a self refresh mode clock enable signal in response to a clock enable signal, a self refresh signal, a self refresh end signal and a test mode signal, wherein the self refresh pulse signal is generated during the inactivated period of the clock enable signal by using the test mode signal;
    a normal mode clock signal generation block for generating a normal mode clock signal and a counter reset signal in response to the clock enable signal, the self refresh mode clock enable signal, a test mode signal and the self refresh signal; and
    an internal row address counter in response to the self refresh pulse signal and the counter reset signal for generating internal addresses for use in the self refresh operation.

2. The apparatus as recited in claim 1, further comprising a '0' address detector for detecting the internal address of all '0's.

3. The apparatus as recited in claim 1, wherein the self refresh pulse signal generation block includes a pulse width controller in response to the self refresh pulse signal and the test mode signal for generating a pulse width controlled self refresh pulse signal.

4. The apparatus as recited in claim 1, wherein the self refresh pulse signal generation block includes a self refresh mode exit block in response to the pulse width controlled self refresh pulse signal, the self refresh mode clock enable signal and the self refresh end signal for generating a self refresh exit signal.

5. The apparatus as recited in claim 1, wherein the self refresh pulse signal generation block includes a self refresh signal generator for generating the self refresh signal in response to the self refresh exit signal and the self refresh entry signal.

6. The apparatus as recited in claim 1, wherein the self refresh pulse signal generation block includes a self refresh pulse generator for generating the self refresh pulse signal in response to the self refresh signal.

7. The apparatus as recited in claim 1, wherein the normal mode clock signal generation block includes:
    a test mode controller for generating a first output signal and the counter reset signal in response to the test mode signal, the self refresh mode clock enable signal and the self refresh signal;
    a normal mode clock enable buffer for generating a normal mode clock enable signal in response to the first output signal and the clock enable signal; and
    a clock buffer for generating the normal mode clock signal in response to the normal mode clock enable signal.

8. The apparatus as recited in claim 4, wherein the self refresh mode exit block includes:

an RS-LATCH for generating a second output signal in response to the pulse width controlled self refresh pulse signal and the self refresh end signal; and a first logic gate for outputting the self refresh exit signal in response to the self refresh mode clock enable signal and the second output signal.

9. The apparatus as recited in claim 7, wherein test mode controller includes:

a second logic gate for outputting the counter reset signal in response to the test mode signal and the self refresh mode clock enable signal; and a third logic gate for outputting the first output signal in response to the self refresh signal and the counter reset signal.

* * * * *